（12） United States Patent
Colby et al.

(10) Patent No.: US 9,190,833 B2
(45) Date of Patent: Nov. 17, 2015

(54) INTEGRATED THERMISTOR AND METALLIC ELEMENT DEVICE AND METHOD

(71) Applicant: Littelfuse, Inc., Chicago, IL (US)

(72) Inventors: James A. Colby, Lombard, IL (US); Stephen Whitnery, Lake Zurich, IL (US); Du Yaosheng, Beijing (CN)

(73) Assignee: LITTELFUSE, INC., Chicago, IL (US)

( * ) Notice: Subject to any disclaimer, the term of this patent is extended or adjusted under 35 U.S.C. 154(b) by 2 days.

(21) Appl. No.: 13/741,974

(22) Filed: Jan. 15, 2013

(65) Prior Publication Data

US 2013/0128406 A1    May 23, 2013

Related U.S. Application Data

(62) Division of application No. 11/828,844, filed on Jul. 26, 2007, now abandoned.

(51) Int. Cl.

| H02H 5/00 | (2006.01) |
|---|---|
| H02H 5/04 | (2006.01) |
| H01C 7/02 | (2006.01) |
| H01H 85/041 | (2006.01) |
| H01H 85/046 | (2006.01) |
| H01H 85/048 | (2006.01) |
| H03K 17/687 | (2006.01) |
| H03K 17/72 | (2006.01) |
| H03K 17/74 | (2006.01) |

(52) U.S. Cl.
CPC .............. *H02H 5/048* (2013.01); *H01C 7/02* (2013.01); *H01H 85/046* (2013.01); *H01H 85/048* (2013.01); *H01H 85/0418* (2013.01); *H01H 2085/0414* (2013.01); *H01H 2085/0483* (2013.01); *H03K 17/687* (2013.01); *H03K 17/72* (2013.01); *H03K 17/74* (2013.01)

(58) Field of Classification Search
CPC .................... H02H 9/042; H05K 2201/10181; H01H 85/36; H01H 85/048; H01H 85/46
USPC ........................................................ 361/104
See application file for complete search history.

(56) References Cited

U.S. PATENT DOCUMENTS

| 6,351,361 | B1 * | 2/2002 | Kawazu et al. ............... 361/103 |
| 7,180,719 | B2 * | 2/2007 | Whitney ....................... 361/119 |

FOREIGN PATENT DOCUMENTS

JP    2002-369372    * 12/2002    ............... H02H 7/18

* cited by examiner

*Primary Examiner* — Stephen W Jackson
(74) *Attorney, Agent, or Firm* — Kacvinsky Daisak Bluni PLLC

(57) ABSTRACT

A circuit protection device includes a fuse element placed in parallel with a PTC thermistor layer. The element and PTC thermistor layer are provided on one or more insulating substrate, such as an FR-4 or polyimide substrate. First and second conductors connect the fuse element and PTC thermistor layer electrically in parallel, such that current (i) initially under normal flows mainly through the fuse element and PTC thermistor layer at a lower drop in voltage and (ii) after an opening of the fuse element flows under normal operation through the PTC thermistor layer at a higher drop in voltage.

6 Claims, 8 Drawing Sheets

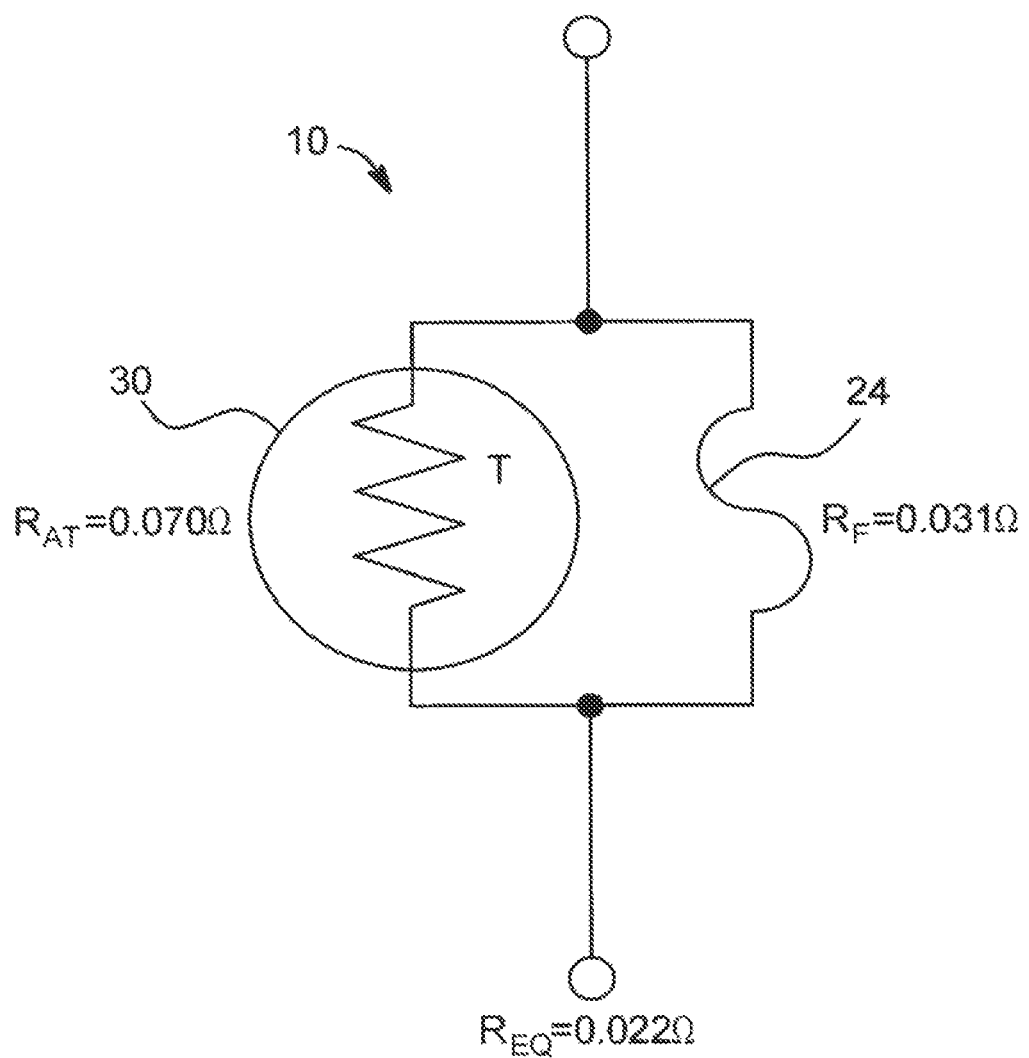

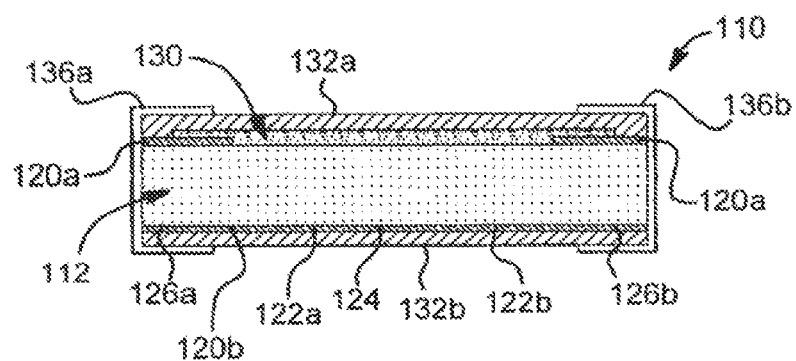
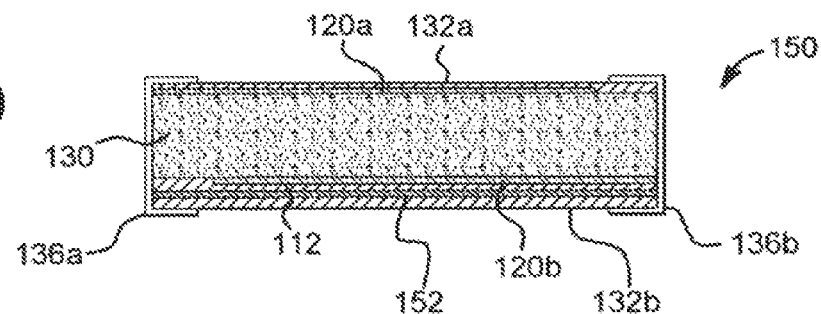
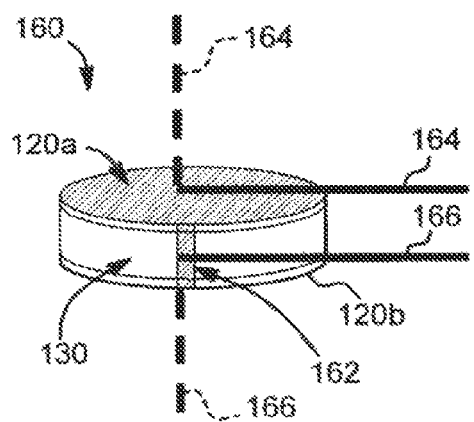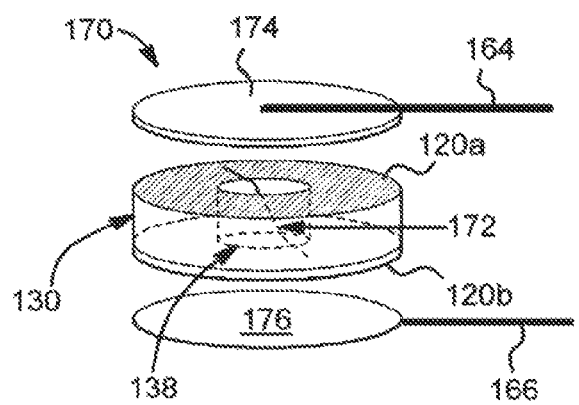
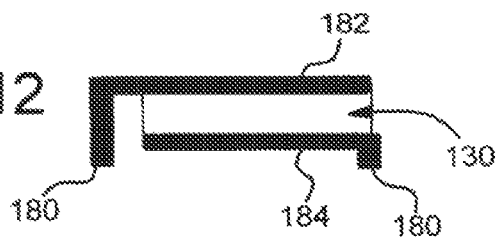

INTEGRATED THERMISTOR AND METALLIC ELEMENT DEVICE AND METHOD

CROSS-REFERENCE TO RELATED APPLICATIONS

This is a Divisional Application of U.S. Ser. No. 11/828,844 filed Jul. 26, 2007, the entirety of which application is incorporated herein by reference.

BACKGROUND OF THE INVENTION

The present disclosure relates generally to circuit protection and more particularly to overcurrent protection.

Fuses for printed circuit board ("PCB") level applications have in many cases been resettable type fuses. The reason is that in many cases, PCB's are heavily populated, making the disposal of an entire PCB due to an opened non-resettable fuse impractical. Replacing an opened non-resettable fuse is also impractical. The PCB may be buried in a machine, automobile, computer, etc., in such a manner that it is virtually impossible to reach. Even if reachable, the PCB may be in a device, e.g., computer, cellular phone or other hand-held device that is used by an individual, making servicing difficult and/or cost prohibitive.

One known resettable fuse that can be sized for PCB level applications is called a positive temperature coefficient ("PTC") device. PTC thermistor materials rely on a physical characteristic germane to many conductive materials, namely, that the resistivity of the conductive materials increases with temperature. Crystalline polymers made electrically conductive via the dispersement of conductive fillers therein, exhibit this PTC effect. The polymers generally include polyolefins such as polyethylene, polypropylene and ethylene/propylene copolymers. Certain doped ceramics such as barium titanate also exhibit PTC behavior.

The conductive fillers cause the resistivity of the PTC thermistor material to increase as the temperature of the material increases. At temperatures below a certain value, the PTC thermistor material exhibits a relatively low, constant resistivity. However, as the temperature of the PTC thermistor material increases beyond this point, the resistivity increases sharply with only a slight increase in temperature.

If a load protected by a PTC thermistor material is short circuited, the current flowing through the PTC thermistor material increases and the temperature of the PTC thermistor material (due to the above-mentioned i.sup.2R heating) rises rapidly to a critical temperature. At the critical temperature, the PTC thermistor material dissipates a great deal of power causing the rate at which the material generates heat to be greater than the rate at which the material can lose heat to its surroundings. The power dissipation only occurs for a short period of time (e.g., a fraction of a second). However, the increased power dissipation raises the temperature and resistance of the PTC thermistor material, limiting the current in the circuit to a relatively low value. The PTC thermistor material accordingly acts as a form of a fuse.

Upon interrupting the current in the circuit, or removing the condition responsible for the short circuit, the PTC thermistor material cools below its critical temperature to its normal operating, low resistance state. The result is a resettable overcurrent circuit protection material.

Even though the PTC thermistor materials operate at lower resistances under normal conditions, the normal operating resistances for PTC thermistor materials are higher than that of other types of fuses, such as non-resettable metallic fuses. The higher operating resistance results in a higher voltage drop across the PTC thermistor material than for similarly rated non-resettable metallic fuses. Voltage drop and power dissipation is becoming increasingly important to circuit designers, who are attempting to maximize the drive capability of a particular circuit as well as battery life.

Accordingly, an improved PCB level circuit protection device is needed. The present disclosure relates in general to circuit protection and more particularly to overcurrent protection. While overcurrent causing events are relatively rare, especially in certain types of devices, they can still occur and accordingly must be protected against. However, it has become apparent that because the short circuit causing events are relatively rare, a device and method adding a non-resettable, e.g., metallic, type fuse element having a lower operating resistance in parallel with one or more resettable, e.g., positive temperature coefficient ("PTC") thermistor, type fuse material provides a desirable overall circuit protection combination.

The parallel combination results in an overall combined or equivalent resistance of the device, which is even lower than the operating resistance of the metallic fuse element. In the unlikely event an overcurrent condition occurs, the metallic fuse element opens and the resistance of the PTC thermistor layer increases, limiting the current and thereby protecting the circuit. When the overcurrent condition or short circuit is removed, the PTC resistance decreases to its normal operating value and the circuit functionality is restored, albeit at a higher operating resistance than with the metallic fuse element intact. This approach offers the benefits associated with lower operating resistance until an overcurrent condition occurs, which in most cases will be the life of the circuitry since, as mentioned previously, overcurrent events are rare.

In one embodiment, therefore, a circuit protection device includes a fuse element placed in parallel with a PTC thermistor layer. The element and PTC thermistor layer are provided on one or more insulating substrate, such as an FR-4 material or polyimide substrate. First and second conductors connect the fuse element and PTC thermistor layer electrically in parallel, such that current (i) initially under normal operation flows through both the fuse element and the PTC thermistor layer causing a lower voltage drop, and (ii) after an opening of the fuse element flows under normal operation through the PTC thermistor layer causing a higher voltage drop.

As shown below, the PTC thermistor layer and metallic fuse element in one embodiment can be configured to have approximately the same time-current opening characteristic. The resulting combination time-current opening more closely tracks that of the PTC thermistor material, especially at higher currents. At lower currents, the combination time-current opening characteristic is slower than either the fuse element or PTC thermistor material. Alternatively, the PTC thermistor layer and metallic fuse element are chosen to have different ratings. For example, the PTC material can be chosen to have a lower rating than the metallic fuse element.

In one embodiment the PTC thermistor layer is polymer based. In an alternative embodiment, the PTC thermistor layer is ceramic. The ceramic-based integrated device can include a thin film type metallic fuse element or a wire fuse element as shown and described below. The ceramic-based device can be mounted via axially or radically disposed leads or be surface mounted.

The metallic fuse element is configured to provide desirable opening characteristics. For example, the metallic element, which can be copper, can be a surface-mounted element for which the length, thickness and/or height of the element is set to provide a desired opening characteristic. Also, a dissimilar metal such as a Metcalf spot can be employed to achieve a desired opening characteristic. The dissimilar metal can be any one or more of nickel, indium, silver and tin.

The fuse element is alternatively a wire fuse element that is single or multi-stranded. The wire can be of a single material or coated with a dissimilar metal. The wire element is bonded, e.g., soldered, to electrodes forming part of the first and second conductors.

The first and second conductors each include a pad or electrode extending to each of the metallic fuse element and PTC thermistor material. An electrode can for example be formed by a photolithographic processes onto the insulating substrate. A PTC thermistor layer is then applied over the electrode and exposed substrate. An electrode can run from a termination of one of the conductors across most of the substrate towards a termination of the second conductor. The length of the electrodes is sized to ensure good contact with the PTC thermistor layer and to allow the PTC thermistor material to function as desired.

In one embodiment, the fuse element is provided on one side of the insulating substrate, while the PTC element is provided on the opposite side of the substrate. In the case of a surface mounted device, the element can be formed by photolithographic processes, e.g., from a copper layer, to have a thin, opening portion and wider pad portions that extend to terminal pads forming initial layers of end terminations of the conductors. The copper pad is then plated with one or more layer, such as electrolytic copper and electrolytic tin. This plating operation forms vias or castellations to electrically connect the pads, electrode and fuse element on each end of the device. The fuse element in an embodiment is provided with a protective cover, such as an epoxy coating. The fuse element side of the overall device in an embodiment is configured to be mounted towards the PCB, so that energy released upon an opening of the element is contained between the device and the PCB.

The device in one embodiment includes a plurality of insulating substrates. For example, the fuse element can be located on the bottom side of a lower insulating substrate. A first conductor includes a first electrode applied (e.g., almost all the way across) to the topside of the bottom substrate. The PTC thermistor layer is then applied to the electrode and to any exposed top of the bottom substrate. A second insulating substrate having a second electrode, e.g., formed by photolithographic processes, on its bottom side is then applied to the top of the PTC thermistor layer. The second electrode extends to the second conductor.

The topside of the second insulating substrate includes copper terminal pads. The upper terminal pads are plated the same as the lower terminal pads in one embodiment. The device can therefore be mounted in either direction, for example, if it is determined in a particular instance that mounting the device with the fuse element towards the PCB risks harming the integrity of the connection of the device to the PCB when the fuse element opens.

The topside of the upper insulating substrate can also be marked with suitable indicia, such as rating indicia and manufacturer information. Again, in an embodiment, the fuse element is provided on the bottom side of the bottommost substrate.

In a further alternative embodiment, one or more additional PTC thermistor layer and insulating substrates are added in the manner described above to produce a device having an overall desired operating characteristic both when the metallic fuse element is intact and when the metallic fuse element has been opened. Adding PTC thermistor layers in general allows for the PTC side of the device to have a higher current rating and may need to be done to match the rating of the metallic fuse element.

In various embodiments, the device is provided in a 1206 (0.120 inch by 0.06 inch) and 1812 (0.180 inch by 0.120 inch) packages.

It is accordingly an advantage of the present disclosure to provide an improved overcurrent protection device.

It is another advantage of the present disclosure to provide a resettable overcurrent device having reduced internal resistance and operating voltage drop.

It is a further advantage of the present disclosure to provide a resettable overcurrent device having a metallic fuse element.

Additional features and advantages are described herein, and will be apparent from, the following Detailed Description and the figures.

BRIEF DESCRIPTION OF THE DRAWINGS

The accompanying drawings illustrate preferred embodiments of the disclosed method so far devised for the practical application of the principles thereof, and in which:

FIG. 4 is a schematic electrical diagram showing an example equivalent resistance for the parallel resettable and non-resettable overcurrent components for the device of FIG. 1.

FIG. 8 is a side-sectioned view of one embodiment of an integrated resettable and non-resettable overcurrent protection device of the present disclosure, which uses a ceramic resettable overcurrent protection material.

FIG. 9 is a side-sectioned view of another embodiment of an integrated resettable and non-resettable overcurrent protection device of the present disclosure, which uses a ceramic resettable overcurrent protection material.

FIG. 10 is a side-sectioned view of a further embodiment of an integrated resettable and non-resettable overcurrent protection device of the present disclosure, which uses a ceramic resettable overcurrent protection material.

FIG. 11 is a side-sectioned view of yet another embodiment of an integrated resettable and non-resettable overcurrent protection device of the present disclosure, which uses a ceramic resettable overcurrent protection material.

FIG. 12 is a side view for any of the embodiments herein showing one surface mounting configuration.

As seen in FIGS. 2A and 2B, second copper layer 16 is etched away from insulating substrate 12 along the right side of device 10. In this manner, electrode 16 does not directly electrically contact a termination formed at the right side of device 10. A similar third copper layer or electrode 18 is etched onto the upper surface of insulating substrate 14. Here, electrode 18 makes contact with a termination formed on the right side of device 10 but does not directly electrically contact a similar termination formed on the left side of device 10. A fourth copper layer 20b is photo-etched away from the bottom side of insulating substrate 14 using standard photolithographic processes. As seen in the bottom of view FIG. 3 of device 10, copper layer 20b is etched to a specific shape to form the metallic fuse element of device 10. Lower copper layer 20b also extends to form a bottom-side base layer of terminations 36a and 36b.

Insulating substrates 12 and 14 having etched copper layers 16, 18 and 20a and 20b, respectively, are sandwiched about a positive temperature coefficient ("PTC") layer 30. One suitable PTC thermistor material for PTC thermistor layer is provided in a Polyfuse® LF1206L device marketed by eventual assignee of the present disclosure. This material is polymer-based. Ceramic configurations are discussed below.

PTC thermistor layer 30 in an embodiment is laminated initially between two large insulating substrates. Electrodes 16, 18, 20a and 20b are preformed on the large insulating substrates prior to their assembly, enabling many devices 10 to be formed from one assembled array. Device 10 is then singulated from the assembled array of insulating substrates and attached PTC thermistor layer via known separation or singulation techniques.

Figure 3:
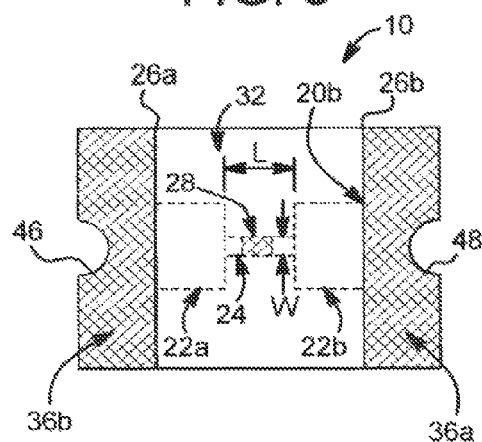
FIG. 3 is a bottom plan view of the integrated resettable and non-resettable overcurrent protection device of FIG. 1.

FIG. 3 illustrates that metallic fuse element 24 is formed on a bottom surface of insulating substrate 14 in one embodiment. Copper layer 20b is photo-etched to a specific shape to form the fuse element. Etched copper layer 20b includes pad areas 22a and 22b, which extend to element 24. Pad areas 22a and 22b also extend to larger termination areas 26a and 26b of copper layer 20b, which are eventually plated along with upper copper layer 20a to form terminations 36a and 36b. The base metal for fuse element 24 is therefore copper in one embodiment.

While device 10 is generally described as having photo-etched copper electrodes, it should be appreciated that electrodes 16, 18, 20a and 20b could be made of alternative metals and applied via a different process, such as an electroplating, sputtering, printing or laminating. Insulating substrates 12 can be made of a polyimide as opposed to an FR-4 material. Either way, electrodes 16, 18, 20a and 20b can be of one or more metal, such as silver, copper, nickel, tin and alloys thereof applied to the surface of the polyimide in any of the above-mentioned ways.

Element 24 has a height h, a length l and width w-sized to create a desirable opening characteristic for fuse element 24. Height h for example can be thinner at element 24 than the height of pads 22a and 22b and termination areas 26a and 26b. The thinned height h of element 24 in an embodiment is formed via a skiving or additional etching process. Element 24 is shown in FIG. 3 as having a generally straight length l. It should be appreciated however that element 24 can alternatively be jagged or curved, e.g., serpentine, to increase the distance l as needed to create a desirable opening characteristic for element 24.

Further, one or more dissimilar metal spot 28, sometimes referred to as a Metcalf spot, can be applied to element 24 at an area of the element desirable for the element to open, e.g., at the center of the element. Dissimilar metal spot 28 can be any one or more of nickel, indium, silver and tin. Dissimilar metal spot 28 has a lower melting temperature than that of the base metal of fuse element 24, e.g., copper. Low melting temperature spot 28 melts more quickly and diffuses into the base metal of element 24. The base and dissimilar metals are chosen such that the diffusion of one into the other results in an intermetallic phase with a lower melting temperature and higher resistance than the base metal, which forces the element to melt at lower level overcurrent levels, and prevents over-heating of the device.

A protective coating 32 is applied to fuse element 24 and a portion of fuse pads 22a and 22b as seen in FIGS. 2 and 3. Protective coating 32 in an embodiment is an electrically insulating epoxy, which is printed, sprayed or otherwise applied to the bottom side of insulating substrate 14 and copper layer 20b forming fuse element 24, pad areas 22a and 22b and termination areas 26a and 26b.

In an embodiment, device 10 is configured such that fuse element 24 is mounted towards the printed circuit board ("PCB"). Protective coating 32 and the downwardly disposed mounting configuration tend to confine the energy released from an opening of fuse element 24. It should be appreciated however that device 10 can operate alternatively with fuse element 24 mounted towards the PCB or away from the PCB.

Figure 1:
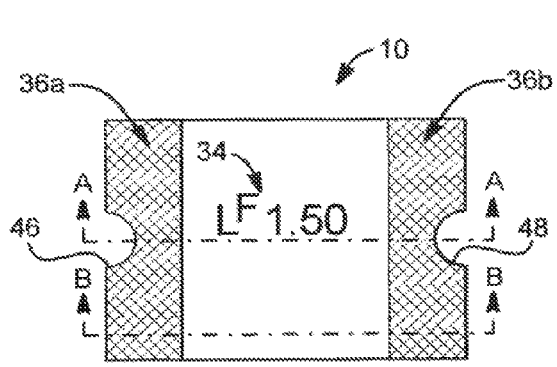
FIG. 1 is a top plan view of one embodiment of an integrated resettable and non-resettable overcurrent protection device of the present disclosure.

FIG. 1 illustrates a top surface of device 10. Here, indicia 34 specifies rating and manufacturer information for device 10. Indicia 34 in an embodiment is applied to, e.g., printed onto, a top surface of upper insulating substrate 12.

Device 10 can be provided in various standard sizes, such as a 1206 package, which is 0.120 inch by 0.06 inch (3.2 mm) by (1.6 mm). Alternatively, device 10 can be provided in an 1812 package, which is approximately 0.179 inch by 0.127 inch (4.5 mm) times.(3.24 mm). It should be appreciated however that device 10 can be made larger or smaller as desired and to produce a device having a desired rating.

Terminations 36a and 36b are formed by standard plating techniques on the upper and lower surfaces of device 10 in the illustrated embodiment. Terminations 36a and 36b can be multiple layers of metal, such as electrolytic copper, electrolytic tin, silver, nickel or other metal or alloy as desired.

Terminations 36a and 36b are sized and configured to enable device 10 to be mounted in a surface mount manner onto a PCB.

Figure 2A:
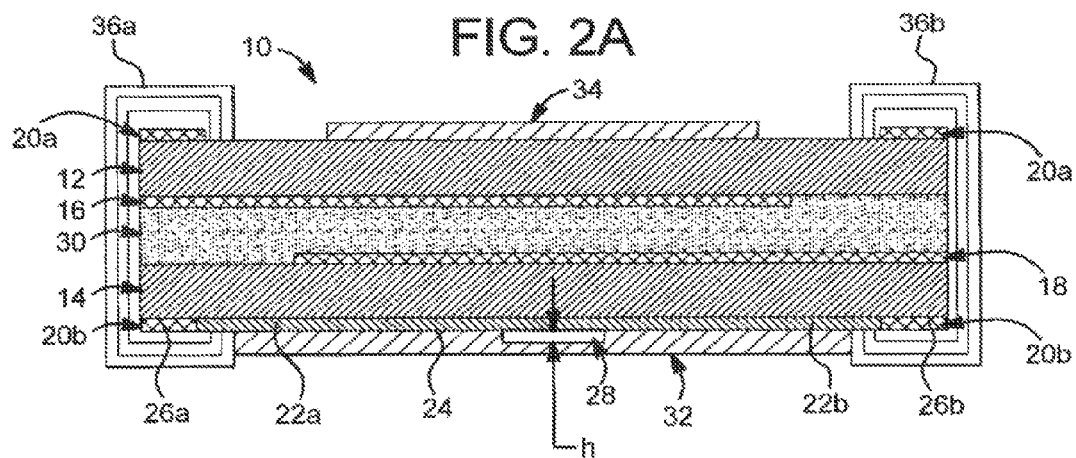
FIG. 2A is a side-sectioned view of the integrated resettable and non-resettable overcurrent protection device taken along line A-A of FIG. 1 showing the terminations extending along the side of the device.
Figure 2B:
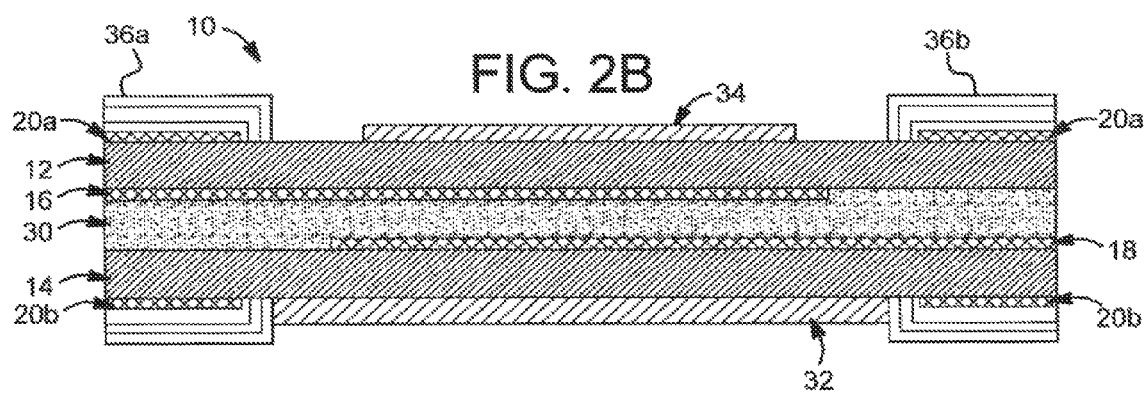
FIG. 2B is a side-sectioned view of the integrated resettable and non-resettable overcurrent protection device taken along line B-B of FIG. 1 showing the terminations not extending along the side of the device at the section.

FIG. 2A illustrates a section A-A of FIG. 1 taken through the middle of device 10. Accordingly, element 24 and dissimilar metal spot 28 are seen in FIG. 2A. A pair of apertures 46 and 48 is made in insulating materials 12 and 14, for example, before device 10 is singulated from the device array. The plating of terminations 36a and 36b covers the sides of apertures 46 and 48. Accordingly, terminations extend along the sides of device 10 at the surfaces of apertures 46 and 48 as seen in FIG. 2A. When device 10 is singulated, terminations 36a and 36b do not extend along the straight sides of the device, e.g., do not extend along the straight sides of the device at section B-B of FIG. 1, as seen in FIG. 2B.

FIG. 4 illustrates an equivalent circuit for device 10 discussed above. The resistances shown in FIG. 4 are merely for the purposes of example and are in no way intended to limit the scope of the claims appended hereto. The resistances do, however, represent realistic values for the present device. Thus PTC thermistor layer 30 (or the combination of multiple PTC thermistor layers 30) is shown for example having a resistance of 0.070 Ohms. Fuse element 24 has a lower resistance of 0.031 Ohms. As seen in FIG. 4 and as should be appreciated from FIG. 2, PTC thermistor layer 30 and fuse element 24 are placed in electrical parallel with each other. According to the resistance equation for parallel devices, the equivalent resistance for device 10, $E_q$ equals the PTC resistance $R_{at}$ multiplied by the fuse resistance $R_f$, which forms a product that is divided by the sum of $R_{at}$ plus $R_f$. This equation yields an equivalent resistance in the example, $R_{eq}$ of 0.022 Ohms. The equivalent resistance is even less than the resistance of the metallic fuse element 24. Device 10 therefore has an initial low resistance operation. Device 10 also has the ability to reset itself through PTC thermistor layer 30.

According to the equivalent circuit of FIG. 4, the current will initially pass through fuse element 24 and PTC thermistor layer 30 until an overcurrent condition occurs, after which the current path through element 24 is opened and current is thereafter shunted in total under normal operation through PTC thermistor layer 30. It is believed that overcurrent events occur relatively infrequently, especially for certain applications using device 10, meaning that in many cases device 10 will operate without seeing an overcurrent condition throughout the entire life of the PCB. That is, many devices 10 will operate under low resistance and low voltage drop conditions throughout the entire life of the PCB. If however an overcurrent event does occur, device 10 maintains its functionality and the PCB onto which it is mounted does not have to be reworked or replaced. The original benefit of low resistance and voltage drop is lost but overall functionality remains.

Figure 5:
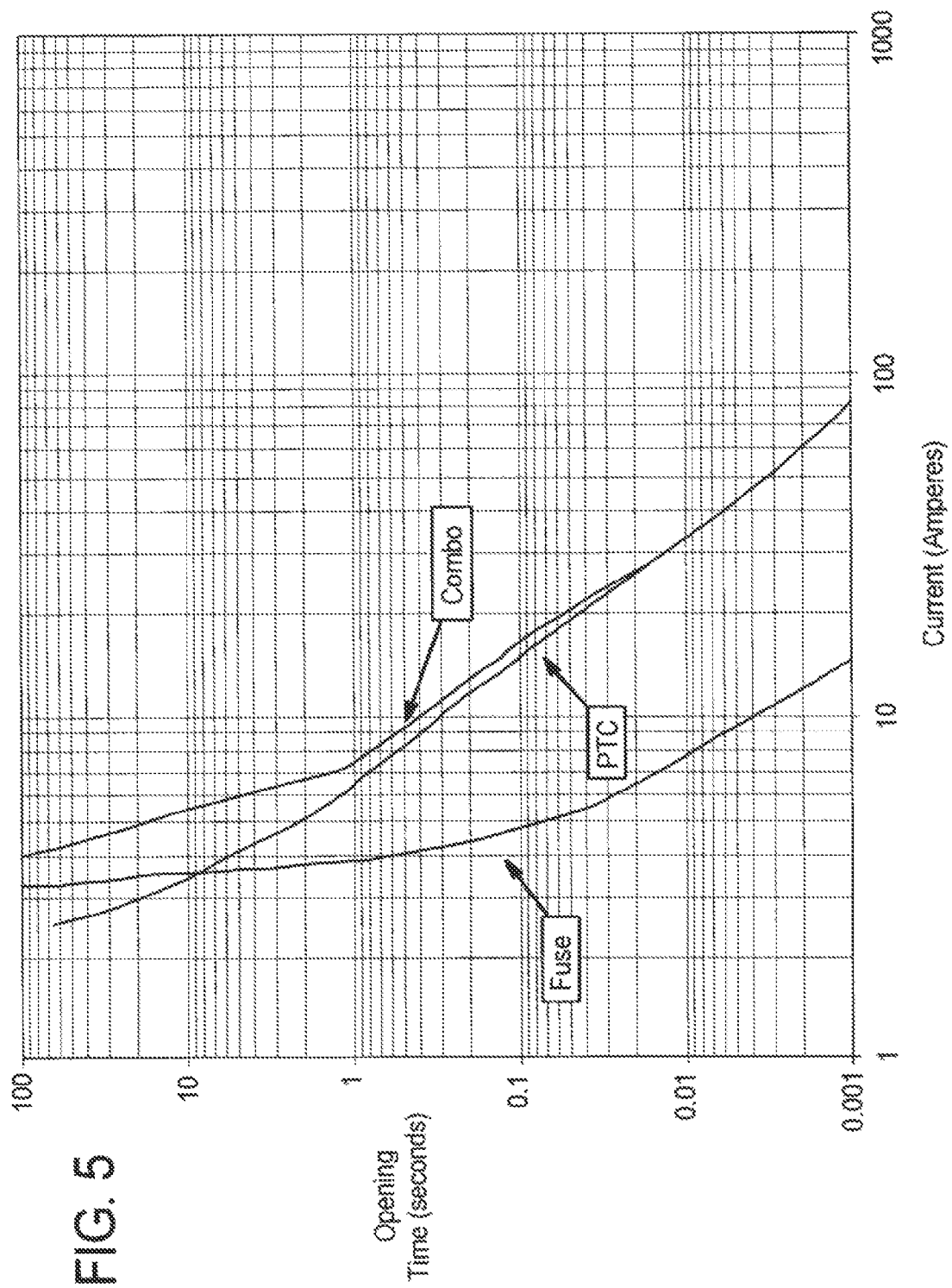
FIG. 5 is a time-current curve obtained from testing a sample of the integrated resettable and non-resettable overcurrent protection device of FIG. 1.

Referring now to FIG. 5, results from testing of a device 10 for time-to-open versus current is illustrated. Three time-current curves are illustrated, one for metallic a fuse element 24 rated for two Amps, one for PTC thermistor layer 30 rated for two Amps and one showing the time-current curve for the two overcurrent components placed in parallel (combo). The combination line tends to follow that of PTC thermistor layer 30 and has a longer response time than that of either fuse element 24 or PTC layer 30.

The illustrated device 10 uses like rated fuse element 24 and PTC thermistor layer 30. Alternatively, device 10 can use a fuse element 24 and PTC thermistor layer 30 having different ratings. For example, PTC thermistor layer 30 could have a lower rating, e.g., 1.5 Amps, than the two Amps of fuse element 24. The resulting device 10 would have a quicker response time, e.g., for a data bus application described in more detail below. The telecommunications and battery applications described below might require a slower acting overall device 10.

Figure 6:
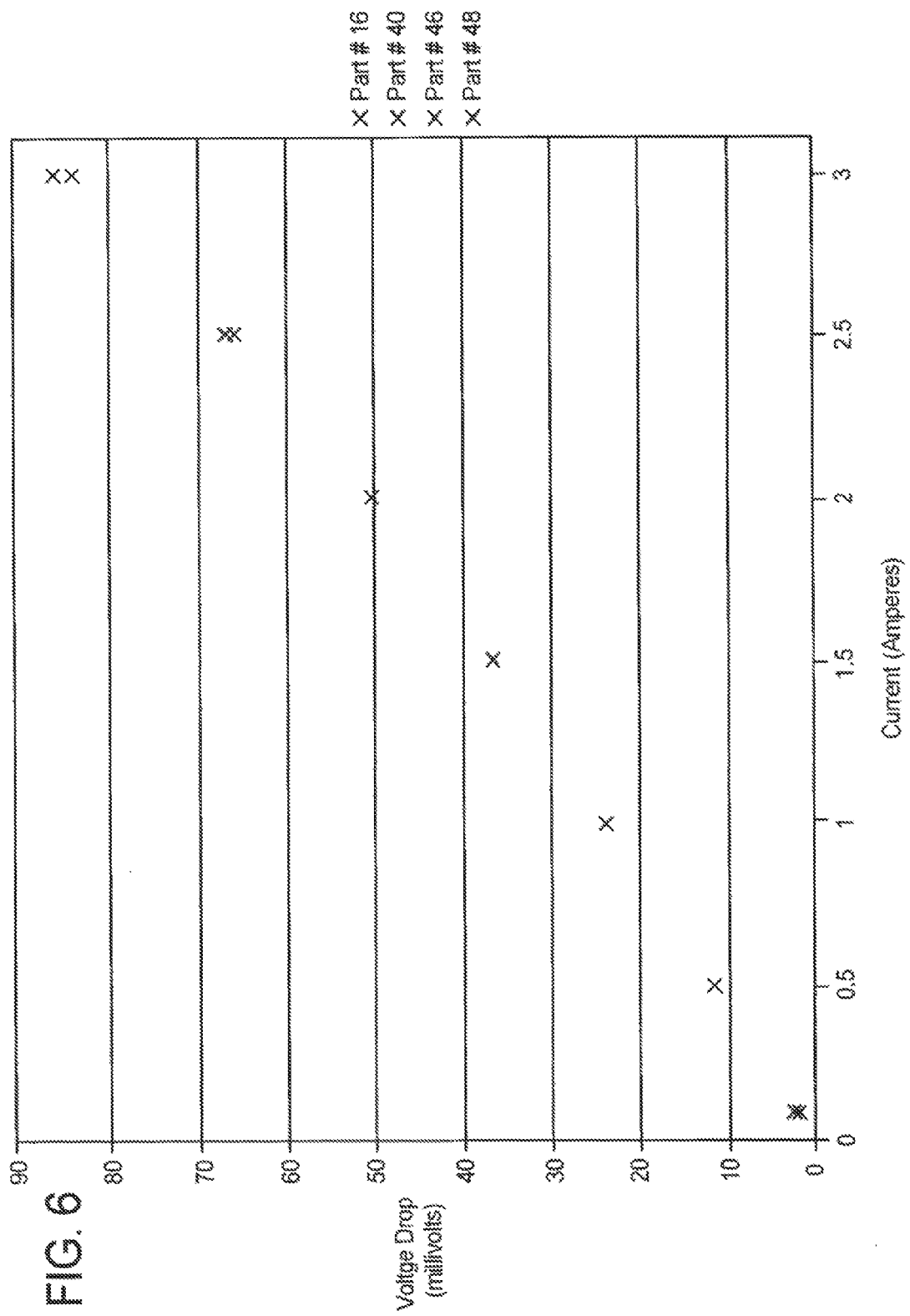
FIG. 6 is a voltage drop versus current plot obtained from testing various samples of the integrated resettable e overcurrent protection device of FIG. 1.

Referring now to FIG. 6, results for four parts made according to the teachings in connection with device 10 for voltage drop versus current testing are illustrated. The plot illustrates that the voltage drop for the four parts was relatively repeatable, especially to about two Amps. Afterwards, the parts begin to show a slight variance. Also, the equivalent resistance of the device remains relatively constant over the illustrated current range. Further, the voltage drop across devices 10 even at three Amps for all four parts tested was maintained under 100 millivolts.

Figure 7:
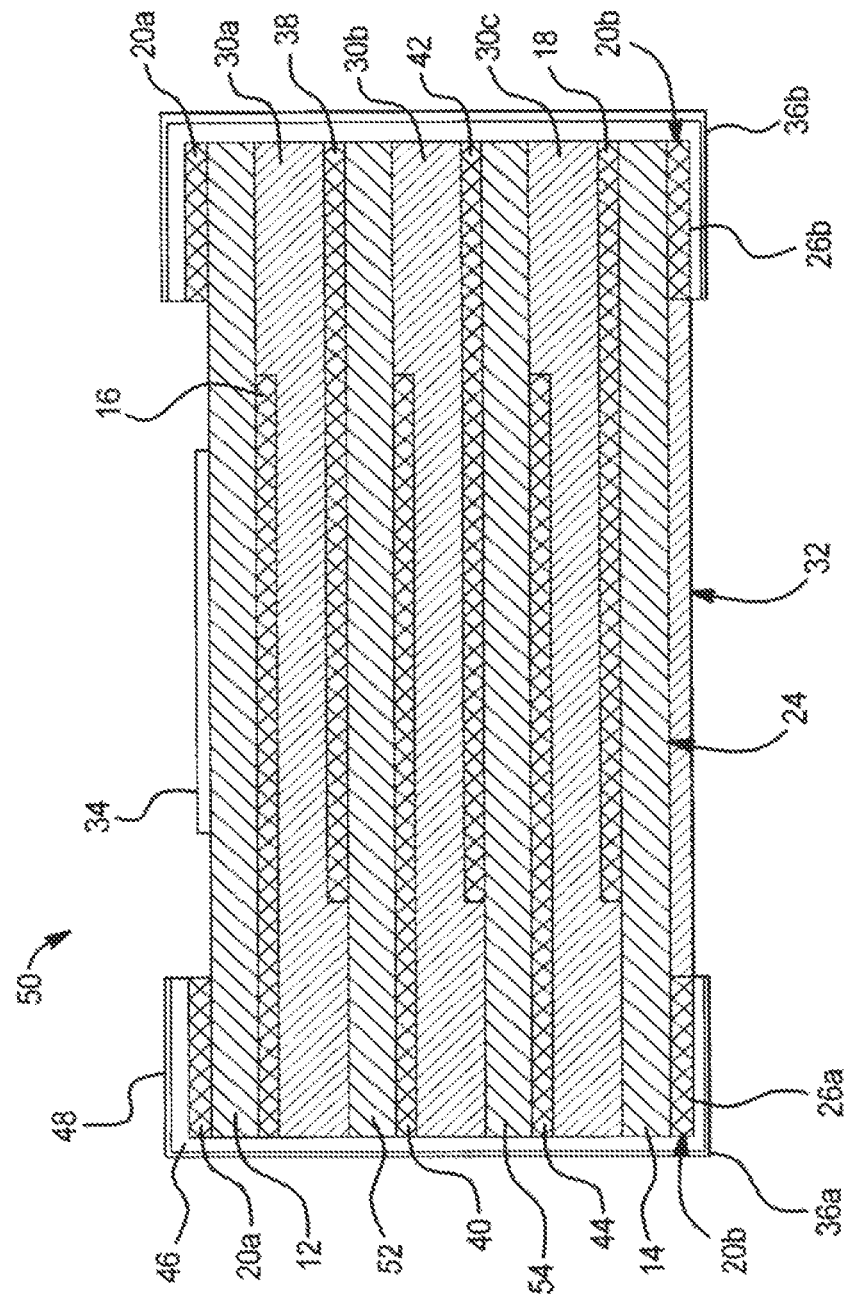
FIG. 7 is a side-sectioned view of an alternative integrated resettable and non-resettable overcurrent protection device of the present disclosure.

Referring now to FIG. 7 an alternative multi layer PTC device 50 is illustrated. Device 50 includes many of the same components discussed above, such as fuse element 24 (and associated pads 22a and 22b and termination areas 26a and 26b). Device 50 also includes a protective coating 32 covering fuse element 24 and a part of the fuse element pads as shown above. In one embodiment, device 50 is configured to mount such that fuse element 24 faces towards the PCB. Alternatively, device 50 could be mounted in the opposite orientation. Device 50 also includes upper and insulating substrate 12 having, e.g., etched electrodes 20a and 16 as described above. Marking text 34 is placed in one embodiment on a top surface of upper insulating substrate 12. Device 50 further includes lower insulating substrate 14 having, e.g., etched upper and lower copper electrodes 18 and 20b. Inner electrodes 16 and 18 as shown above extend at least halfway across their associated substrates 12 and 14 to create a desired opening characteristics for adjacent PTC thermistor layers 30a and 30b (referred to herein collectively as PTC thermistor layers 30 or generally, individually as PTC thermistor layer 30).

Device 50 includes three PTC thermistor layers 30a, 30b and 30c (collectively 30). Device 50 further includes two additional inner insulating substrates 52 and 54 having, e.g., upper and lower electrodes 38, 40, 42 and 44, respectively, which like electrodes 16 and 18 extend the majority of the way across their respective insulated substrate 52, 52, 54, and 54. Each of the electrodes 16, 18, 20a, 30b, 38, 40, 42 and 44 can be etched or formed as otherwise described herein onto a respective FR-4 or polyimide insulating substrate 12. PTC thermistor layers 30 are sandwiched between respective electrode bearing insulating substrates via any of the methods described above. Device 50, like device 10, can be made as an array of devices 50, which are singulated into individual devices.

PTC thermistor layers 30a to 30c each operate the same as PTC thermistor layer 30 of device 10, namely, the layers are conductive under normal operating current loads. Upon an overload condition that opens fuse element 24, PTC thermistor layers 30 heat up causing their temperatures and resistances to rise to a threshold point at which the temperatures and resistances increase exponentially, resulting in a highly resistive electrical path, akin to an open-circuit of fuse element 24. The additional PTC thermistor layers for a given size package increase the rating of the PTC component of device 50. Thus while three PTC thermistor layers 30 are shown with device 50, two layers or four or more layers could be provided as needed to produce a device 50 having a desirable fuse rating. The collective rating of PTC thermistor layers 30 can be the same or slightly different, e.g., lower than that of metallic element 24.

Referring now to FIG. 8, device 110 illustrates an alternative integrated metallic/PTC thermistor device. Here, PTC thermistor layer 130 is ceramic-based as opposed to the polymeric material of the Polyfuse® LF1206L device. One suitable ceramic-based thermistor material is disclosed in U.S. Pat. No. 6,218,928, entitled "PTC Thermistor Material", assigned on its face to TDK Corporation (Tokyo, JP).

Device 110 includes an insulating substrate 112, which can for example be an ceramic material or glass. Upper and lower base electrodes 120a and 120b are formed respectively on upper and lower surfaces of substrate 112 via thick film screen printing or sputtering. Electrodes 120a and 120b can again be formed of one or more metal, such as silver, copper, nickel, tin and alloys thereof applied to the surface of the polyimide in any of the above-mentioned ways.

Base electrode 120b is shaped to form the fuse element. Electrode 120b for example includes pad areas 122a and 122b extending inwardly to element 124 and outwardly to larger termination areas 126a and 126b as shown above with electrode 20, pad areas 22, element 24 and termination areas 26. Termination areas 126a and 126b are eventually plated along with upper copper layer 120a to form terminations 136a and 136b. Metallic fuse element 124 of device 110 can have any of the shapes, dimensions and dissimilar metals discussed above for element 24 of devices 10 and 50.

A ceramic PTC ("CPTC") thermistor layer 130 is located on a first side of insulating base 112, e.g., via thick film screen printing or spin coating. As illustrated, CPTC thermistor layer 130 contacts portions of electrodes 120a. An upper cover layer 132a (e.g., fired glass) is applied to CPTC thermistor layer 130 and exposed portions of electrodes 120a. Although not shown, marking indicia (discussed above) can be provided on the top surface of CPTC thermistor layer 130 and be viewable through upper cover layer 132a.

A lower cover layer 132b (e.g., fired glass) is applied to lower electrode 120b and exposed portions of substrate 112. Terminations 136a and 136b are formed on the side edges of substrate 112, electrodes 120a and 120b and cover layers 132a and 132b. Terminations 136a and 136b also cover portions of the top and bottom surfaces, respectively, of, e.g., glass, cover layers 132a and 132b. Terminations 136a and 136b can include multiple metallizations as discussed and shown above. Further, multiple CPTC thermistor layers 130 can be applied between multiple insulating layers 112 in a manner similar to the polymeric device of FIG. 7.

In operation, current flows from e.g., termination 136a to termination 136b through upper and lower electrodes 120a and 120b and both CPTC thermistor layer 130 and the metallic fuse element in parallel until the fuse element opens. Upon the opening of the fuse element, CPTC thermistor layer 130 becomes highly resistive and limits the current traveling from termination 136a to termination 136b. When the power surge has dissipated, CPTC thermistor layer 130 becomes conducting such that current can travel across device 110.

Referring now to FIG. 9, device 150 illustrates an alternative integrated metallic/CPTC thermistor device. Here again, CPTC thermistor layer 130 is ceramic based as opposed to the polymeric material of the Polyfuse® LF1206L device. In device 150, CPTC thermistor layer 130 doubles as the base substrate, taking advantage of the relatively rigid nature of the ceramic based material.

Upper and lower base electrodes 120a and 120b are formed respectively on upper and lower surfaces of CPTC thermistor layer 130 via thick film screen printing or sputtering. Electrodes 120a and 120b can be of one or more metal, such as silver, copper, nickel, tin and alloys thereof applied to the surface of CPTC thermistor layer 130 in any of the above-mentioned ways.

In device 150, lower base electrode 120b does not form the metallic fuse element but instead acts with CPTC thermistor layer 130, upper base electrode 120a and terminations 136a and 136b to allow current to flow through CPTC thermistor layer 130 under normal operating conditions.

A thin insulating layer 112, e.g., glass, is applied over lower base electrode 120b and any exposed area of the bottom surface of CPTC thermistor layer 130. A third, fuse element electrode 152 is shaped onto substrate 112 to form the fuse element. Electrode 152 can for example include the same pad areas 122a and 122b extending inwardly to element 124 and outwardly to larger termination areas 126a and 126b (shown above in FIG. 8). The metallic fuse element of device 150 can have any of the shapes, dimensions and dissimilar metals discussed above for element 24 of devices 10 and 50 and element 124 of device 8.

An upper cover layer 132a (e.g., glass) is applied to upper base electrode 120a and exposed portions of CPTC thermistor layer 130. Although not shown, marking indicia (discussed above) can be provided on the top surface of upper base electrode 120a and be viewable through upper cover layer 132a.

A lower cover layer 132b (e.g., glass) is applied to fuse element electrode 152 and exposed portions of substrate 112. Terminations 136a and 136b are formed on the side edges of CPTC thermistor layer 130, substrate 112, electrodes 120a, 120b and 152 and cover layers 132a and 132b. Terminations 136a and 136b also cover portions of the top and bottom surfaces, respectively, of, e.g., glass, cover layers 132a and 132b. Terminations 136a and 136b can include multiple metallizations as discussed and shown above.

In device 150 operation, current flows from, e.g., termination 136a to termination 136b through upper electrodes 120a, CPTC thermistor layer 130, electrode 120b and metallic fuse element layer 150 until the fuse element opens. Upon the opening of the fuse element, CPTC thermistor layer 130 becomes non-conducting and prevents current form traveling from termination 136a to termination 136b. When the power surge has dissipated, CPTC thermistor layer 130 becomes conducting, such that current can travel again across device 150.

Referring now to FIG. 10, an alternative CPTC thermistor device 160 is illustrated. CPTC thermistor device 160 advantageously uses both upper and lower base electrodes 120a and 120b to contact both CPTC thermistor layer 130 and fuse element 162, which in the illustrated embodiment is a thick film, thin film or wire bonded fuse element. Fuse element 162, shown as being generally vertically disposed, extends along the edge of the CPTC thermistor layer 130 from one base electrode 120a to the other base electrode 120b. The angle, shape and number of such fuse elements can vary. Base electrodes 120a and 120b are also formed on both sides of CPTC thermistor layer 130 via any suitable technique and from any suitable one or more metal described above.

Device 160 in the illustrated embodiment also includes leads 164 and 166, which can be radially or axially disposed for different mounting arrangements. In device 160 operation, current flows from e.g., upper electrode 120a (lead 164) to lower electrode 120b (lead 166), through CPTC thermistor layer 130 and fuse element 162 in parallel until the fuse element opens. Upon the opening of the fuse element, CPTC thermistor layer 130 becomes non-conducting and prevents current form traveling from upper electrode 120a (lead 164) to lower electrode 120b (lead 166). When the power surge has dissipated, CPTC thermistor layer 130 becomes conducting, such that current can travel again across device 160.

Referring now to FIG. 11, an alternative CPTC thermistor device 170 is illustrated, which is the same as device 160 except that CPTC thermistor layer 130 includes or defines a larger diameter hole or aperture 138 configured to accept a diagonally disposed fuse element 172. Fuse element 172 as shown is soldered or otherwise connected electrically to base electrodes 120a and 120b located on opposite sides of aperture 138. Element 172 is shown extending diagonally across the aperture. The diagonal extension allows element 172 to be lengthened, which can be beneficial for sizing purposes.

CPTC thermistor device 170 also disposes leads 164 and 166 on endplates 174 and 176, respectively, which are in turn soldered to or otherwise connected to base electrodes 120a and 120b, respectively. Endplates 174 and 176 cover aperture 138, protect fuse element 172 and connect the fuse element electrically to leads 164 and 166. Furthermore, the endplates allow the final part to be coated with a protective material, e.g., epoxy, maintaining a void in aperture 138, which improves the fusing performance of fuse element 172. Leads 164 and 166 are shown extending from endplates 174 and 176 in a radial fashion. Alternatively, leads 164 and 166 extend from endplates 174 and 176 in an axial direction, e.g., as shown in FIG. 10.

The wire fuse element CPTC thermistor devices 160 and 170 operate the same as the thin film CPTC thermistor devices 110 and 150, which operate at least substantially the same as the polymer based PTC thermistor devices discussed above. Current under normal operation flows through both CPTC thermistor layer 130 and fuse elements 124, 152, 162 or 172 until an overcurrent event occurs. At such time, the fuse element opens, CPTC thermistor layer 130 becomes non-conducting, such that device 110, 150, 160 or 170 does not allow the overcurrent to pass to electrical components downstream of the device. When the overcurrent event subsides, CPTC thermistor layer 130 resets itself to a conducting state, allowing the protected circuit to function, albeit at a larger voltage drop across device 110, 150, 160 or 170.

FIG. 12 shows a surface mount configuration for either of the devices described in FIG. 10 or 11. Here, the PTC or CPTC device includes end plates 182 and 184, each having a pad area 180 configured to be reflow or wave soldered to a printed circuit board. The illustrated embodiment shows a CPTC disk 130 (fuse element present but not seen), wherein end plates 182 and 184 and pad areas 180 connect the CPTC disk 130 and fuse element electrically to a trace pattern on the printed circuit board.

Figure 13:
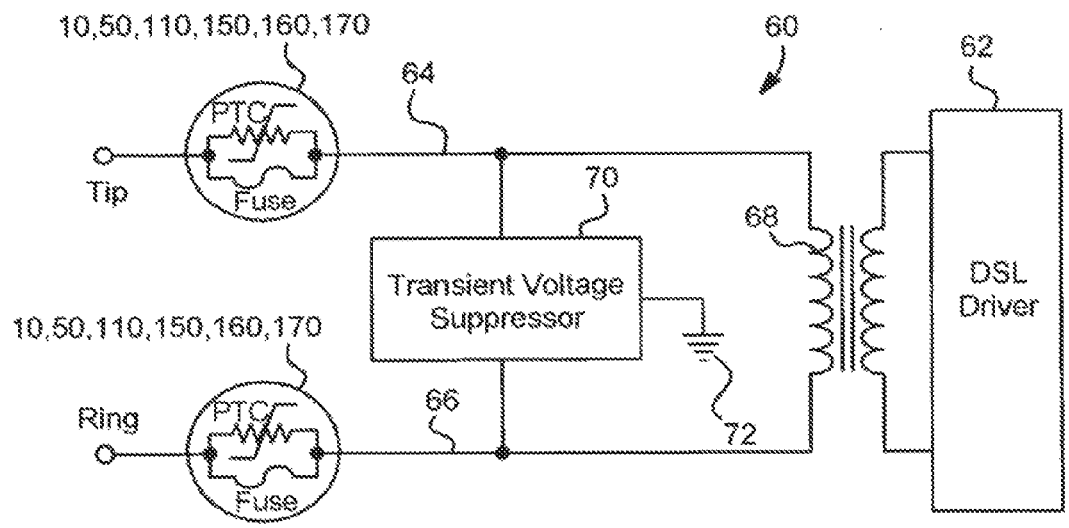
FIG. 13 is a schematic electrical view of a telecommunications circuit employing a pair of integrated resettable overcurrent protection devices of the present disclosure.

Referring now to FIG. 13, circuit 60 illustrates one suitable application for device 10, 50, 110, 150, 160, 170 (referred to simply as device 10 hereafter for convenience) namely a telecom protection application. Telecom protection circuit 60 includes a digital transcriber line ("DSL") driver 62, which can be an interface card located between downstream telecom equipment (not shown) and the data lines shown in FIG. 8. The telecom equipment can include equipment for a central office switch, which switches calls from one point to another, e.g., switches digital voice or internet data.

DSL driver 62 conditions the signals and regenerates the signals to a switch or other apparatus of the telecom equipment. DSL driver 62 is a bi-directional transceiver that conditions signals sent in both directions over tip line 64 and ring line 66. Transformer 68 prevents direct current ("DC") residing on either side of the transformer from being propagated to the other side of the transformer. Transformer 68 also cancels any noise or signal crosstalk from adjacent lines that are coupled, and therefore common, to both the tip and ring lines. Transformer 68 accordingly couples differential signals.

Transient voltage suppressor 70 includes an overvoltage protection device, such thyristor. Suppressor 70 can for example use a plurality of diodes positioned with a thyristor to reduce capacitance along any path, e.g., from tip line 64 to ring line 66, tip line 64 to ground 72, and ground 72 to ring line 66. The diodes and thyristor are positioned such that each path has at least three capacitance reductions, providing heavily biased pathways that reduce the capacitance stepwise in series to a very low level that will not attenuate or discourage the data signals.

Integrated fuse element/PTC device 10 are positioned in ring line 64 and tip line 66 to protect against an overcurrent condition due for example to a power-cross situation, in which a phone line or data line becomes inductively coupled to a power line, producing a continuous overvoltage condition. Transient voltage suppressor 70 clamps the overvoltage at a safe level, dissipating a great deal of energy and triggering overcurrent device 10.

If only a metallic element is used, the corresponding fuse in circuit 60 has to be replaced. If only a PTC element is used, the resistance of the PTC element is substantially higher, limiting how far DSL driver 62 can drive the DSL signals down tip 64 or ring 66 lines. Because power-cross line conditions are rare, device 10 provides a resettable device that operates initially at a low resistance. If a power-cross condition does occur, the fuse element opens and the PTC device trips and eventually resets, such that circuit 60 still functions, at least at a limited range of data travel.

Figure 14:
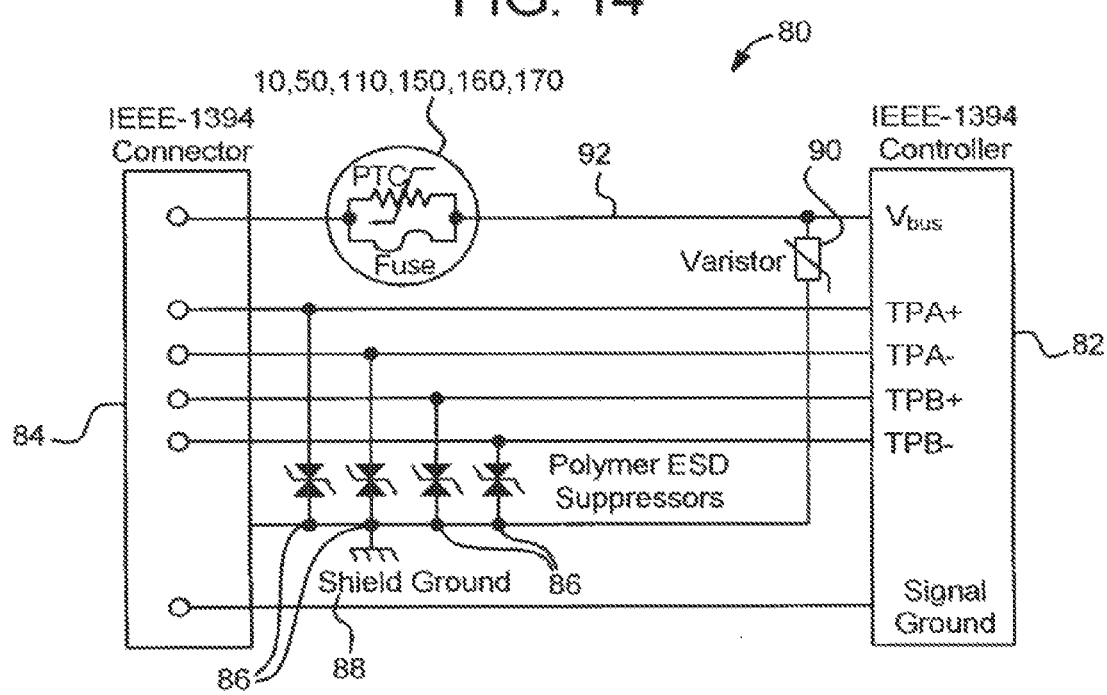
FIG. 14 is a schematic electrical view of a data bus circuit employing an integrated resettable overcurrent protection device of the present disclosure.

Referring now to FIG. 14, circuit 80 illustrates another application for integrated fuse element/PTC device 10, namely, a data bus circuit. The illustrated data bus circuit uses an IEEE 1394 controller 82, which is used with computers and other equipment, such as video cameras and cable boxes. Associated 1394 connector 84 is small, which is advantageous for the above applications. Circuit 80 uses two twisted pair conductors TPA and TPB, which each transmit data bi-directionally between controller 82 and connector 84.

Circuit 80 includes transient voltage suppressors 86 placed across the data lines to ground 88. Voltage suppressors 86 suppress electrostatic discharge ("ESD") events occurring on data lines TPA and TPB. Circuit 80 also includes a varistor 90, which suppresses ESD or other transients occurring on voltage line V.sub.bus 92. V.sub.bus is for example a 33 VDC source that controller 82 uses to drive voltage down line 92 to power whatever is connected to connector 84, e.g., a printer or modem.

Integrated fuse element/PTC device 10 protects associated equipment from any type of overcurrent condition occurring on power line 92. Here again, it is desirable that device 10 have as low a resistance as possible, so that the voltage drop across the device is as low as possible, and so that as much power can be delivered from controller 82 to connector 84 and associated devices as possible. Device 10 is accordingly well-suited for this application because it is unlikely that line 92 will experience an overcurrent condition.

Device 10 can be used equally as effectively in universal serial bus ("USB") data circuits and applications. Further, the devices can be used in a powered Ethernet circuit. In a power over Ethernet circuit, two of the four twisted pairs in a Cat3/5 cable carry power and may also carry data. Power delivery capability for such circuit is limited, making device 10 well suited for such application.

Figure 15:
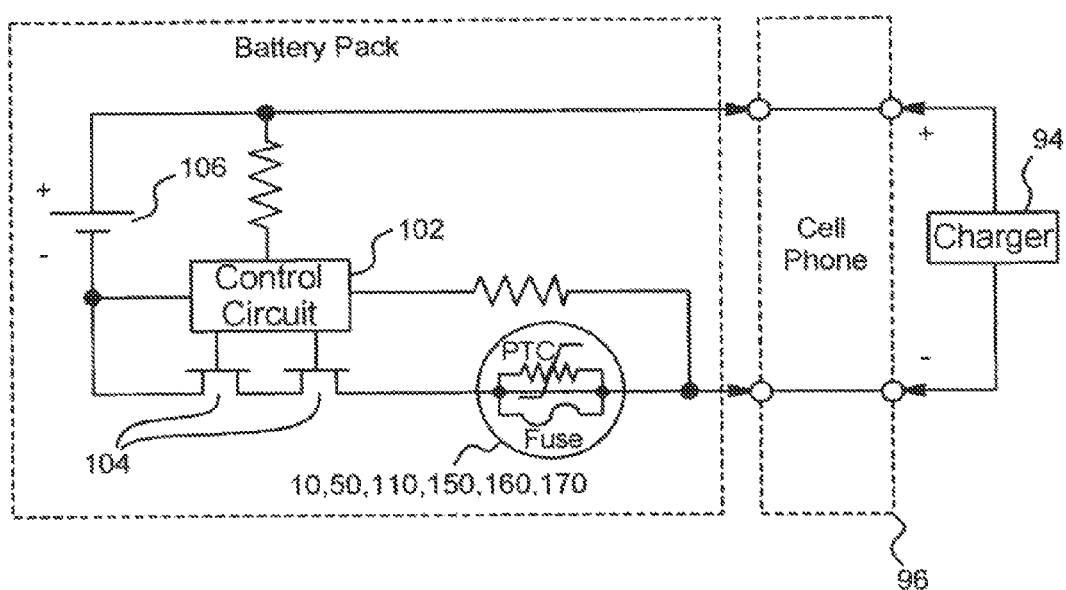
FIG. 15 is a schematic electrical view of a battery pack circuit employing an integrated resettable overcurrent protection device of the present disclosure. Referring now to the drawings and in particular to FIGS. 1, 2A, 2B and 3, device 10 illustrates one embodiment of an integrated resettable and non-resettable circuit protection device and associated method of the present disclosure. Device 10 includes an upper insulating substrate 12 and a lower insulating substrate 14 (referred to herein collectively as insulating substrates 12 or generally, individually as insulating substrate 12). In an embodiment insulating substrates 12 are made of a same material, such as an FR-4 material or a polyimide. For example, substrate 12 can be supplied with a copper coating on both surfaces of the FR-4 material. The copper in one embodiment is then etched away using standard photolithographic processes to form various electrode patterns. For example, the copper plating can be etched away to form an upper copper layer 20a forming a base layer of terminations 36a and 36b.

Referring now to FIG. 15, circuit 100 illustrates a further application for integrated fuse element/PTC device 10, namely, a battery protection circuit. Circuit 100 operates with a charger 94 for, e.g., a cellular phone 96. Control circuit 102 of battery pack circuit 100 senses a voltage supplied by charger 94. If, for example, the polarity of the voltage is wrong, or the voltage level is wrong, controller 102 opens redundant field effect transistor ("FET") switches 104 to stop any current from flowing through circuit 100 to battery 108. Control circuit 102 can also monitor temperature to look for thermal runaway. Here too, circuit 102 shuts down the current flow via switches 104 to battery 108.

PTC fuse device 10 provides a layer of redundant circuit protection. For example, if control circuit 102 does not operate properly or FET's 104 become shorted, PTC fuse device 10 provides a backup layer of overcurrent protection. Battery 106 of battery pack 100 varies in DC voltage making the low resistance of device 10 important. For example, if an over-current device in a three VDC battery pack drops ¼ VDC, the over-current device consumes eight percent of the life of the battery. Battery 108 can have a drop-out voltage below which the cellular phone does not work, making the above life consumption percentage even higher. Thus a voltage drop in the millivolt range for device 10 in FIG. 6 is well-suited for this application.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

What is claimed is:

1. A circuit protection method comprising:
protecting a first electrical pathway in a device using a substrate that comprises and operates as a resettable fusing apparatus having a first electrical resistance; and
protecting a second electrical pathway in the device that is electrically in parallel with the first electrical pathway with a non-resettable fusing apparatus extending along a surface of the substrate and having a second electrical resistance, wherein the first electrical resistance is relatively higher than the second electrical resistance such that current (i) initially under normal operation flows through both the resettable and non-settable fusing apparatuses at a lower drop in voltage, and (ii) after an opening of the non-resettable fusing apparatus flows under normal operation through the resettable fusing apparatus at a higher drop in voltage.

2. The circuit protection method of claim 1, wherein the resettable fusing apparatus includes at least one positive temperature coefficient layer.

3. The circuit protection method of claim 1, wherein the non-resettable fusing apparatus includes at least one fuse element.

4. The circuit protection method of claim 1, including configuring the device for operation in a tip or ring line of a telecommunications circuit.

5. The circuit protection method of claim 1, including configuring the device for operation in a voltage supply line between a data bus controller and a data bus connector.

6. The circuit protection method of claim 1, including configuring the device for operation in a charging line of a battery pack.

* * * * *